United States Patent [19]

Araki et al.

[11] Patent Number: 5,539,274

[45] Date of Patent: Jul. 23, 1996

[54] ELECTRON BEAM EXCITED PLASMA SYSTEM

[75] Inventors: Youichi Araki, Nirasaki; Kazuya Nagaseki, Yamanashi-ken; Shuji Mochizuki, Kofu, all of Japan

[73] Assignees: Tokyo Electron Limited, Tokyo; Tokyo Electron Yamanashi Limited, Nirasaki, both of Japan

[21] Appl. No.: 301,566

[22] Filed: Sep. 7, 1994

[30] Foreign Application Priority Data

| Sep. 7, 1993 | [JP] | Japan | 5-221608 |
| Dec. 24, 1993 | [JP] | Japan | 5-347571 |
| Jun. 30, 1994 | [JP] | Japan | 6-150164 |

[51] Int. Cl.⁶ ............................................. H05H 1/16
[52] U.S. Cl. ........................ 313/362.1; 313/231.31; 250/423 R
[58] Field of Search ........................ 313/362.1, 361.1, 313/360.1, 231.31; 315/500, 502, 503; 156/345; 250/423 R

[56] References Cited

U.S. PATENT DOCUMENTS

| 2,574,655 | 11/1951 | Panofsky et al. | 250/396 R |
| 3,613,370 | 10/1971 | Paine | 60/202 |
| 3,659,134 | 4/1972 | Wanner | 313/457 |
| 4,297,615 | 10/1981 | Goebol et al. | 315/111.21 |
| 4,367,429 | 1/1983 | Wang et al. | 313/362.1 |
| 4,584,160 | 4/1986 | Kageyama | 376/141 |
| 4,739,169 | 4/1988 | Kurosawa et al. | 250/423 R |
| 4,749,910 | 6/1988 | Hara et al. | 315/111.81 |
| 4,749,912 | 6/1988 | Hara et al. | 315/111.81 |
| 4,853,102 | 8/1989 | Tateishi et al. | 204/298.06 |
| 4,870,284 | 9/1989 | Hashimoto et al. | 250/423 R |
| 4,931,698 | 6/1990 | Yoshida | 315/111.81 |
| 4,933,551 | 6/1990 | Bernius et al. | 250/288 |
| 5,105,161 | 4/1992 | Takami et al. | 315/500 |
| 5,326,981 | 7/1994 | Hara et al. | 250/492.21 |
| 5,336,975 | 8/1994 | Goebel et al. | 315/111.41 |
| 5,350,974 | 9/1994 | Jacquot | 315/111.81 |
| 5,359,254 | 10/1994 | Arkhipov et al. | 313/15 |
| 5,365,070 | 11/1994 | Anderson et al. | 250/423 R |
| 5,397,956 | 3/1995 | Araki et al. | 313/231.31 |
| 5,413,663 | 5/1995 | Shimizu et al. | 156/345 |

*Primary Examiner*—Michael Horabik
*Assistant Examiner*—Lawrence O. Richardson
*Attorney, Agent, or Firm*—Oblon, Spivak, McClelland, Maier & Neustadt

[57] ABSTRACT

An electron beam excited plasma system is provided with a first auxiliary electrode for initial discharge, an anode having an opening, a cathode, having an opening and located between the anode and the first auxiliary electrode, for producing an initial discharge between the first auxiliary electrode and the cathode, and for producing a plasma-generating discharge between the anode and the cathode, a second auxiliary electrode, having an opening and located between the cathode and the anode, for facilitating the generation of the discharge plasma between the cathode and the anode, a gas supply device for supplying a discharge plasma-generating gas into the region between the cathode and the anode, and magnetic field generator for generating a magnetic field and for applying this magnetic field to the region between the cathode and the anode, such that a cusp magnetic field is generated in the vicinity of the cathode.

35 Claims, 9 Drawing Sheets

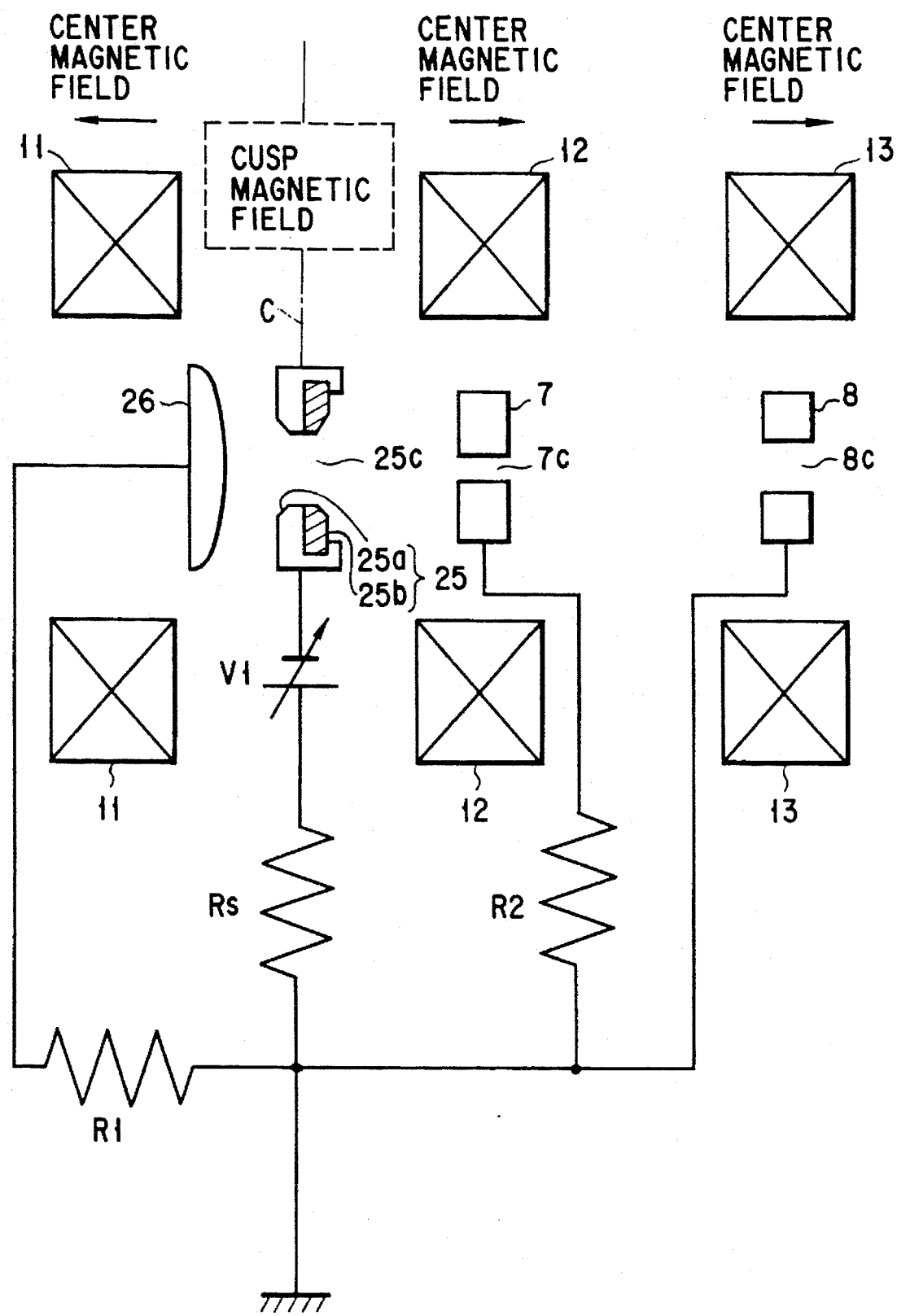
F I G. 3

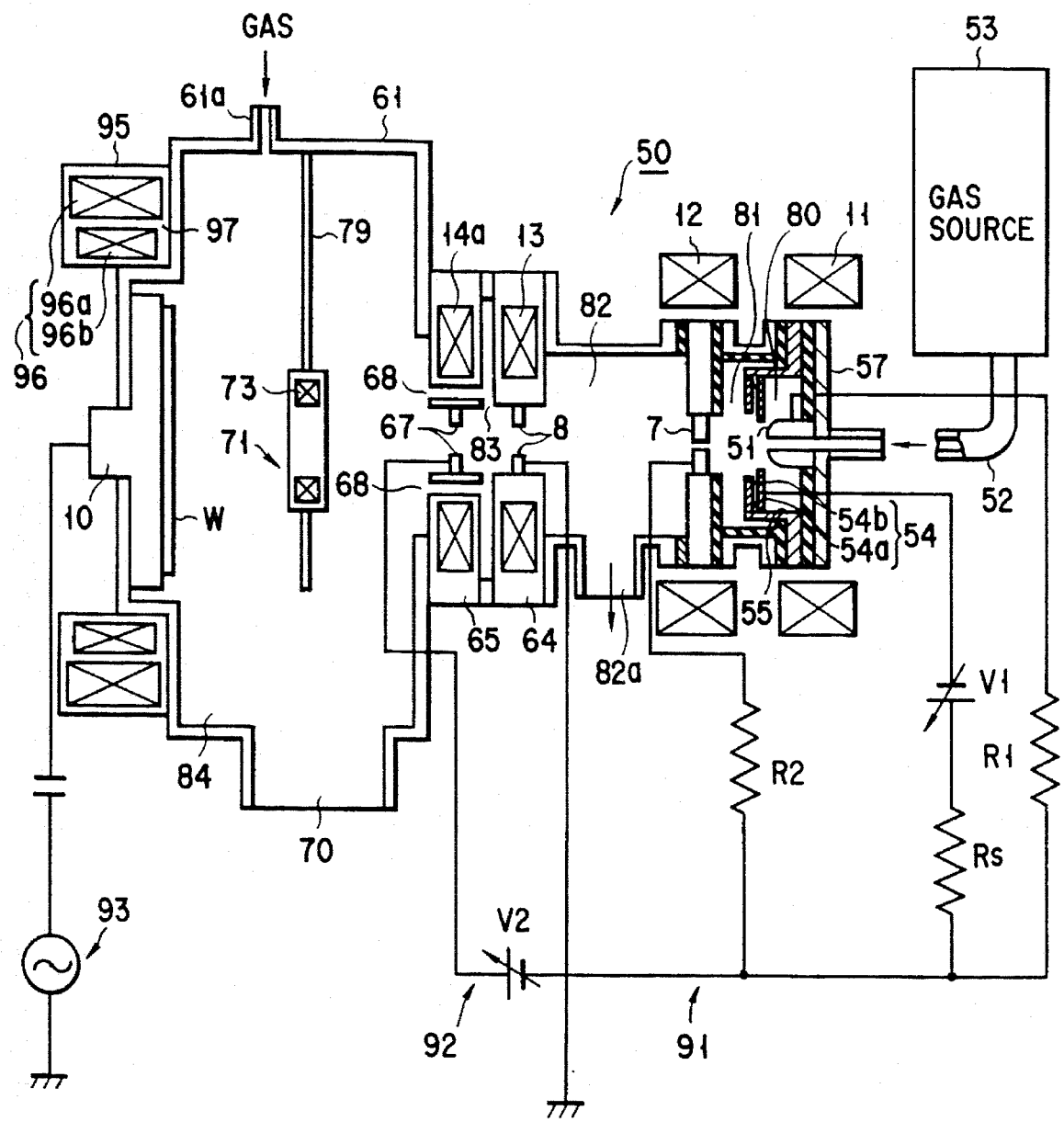
F I G. 4

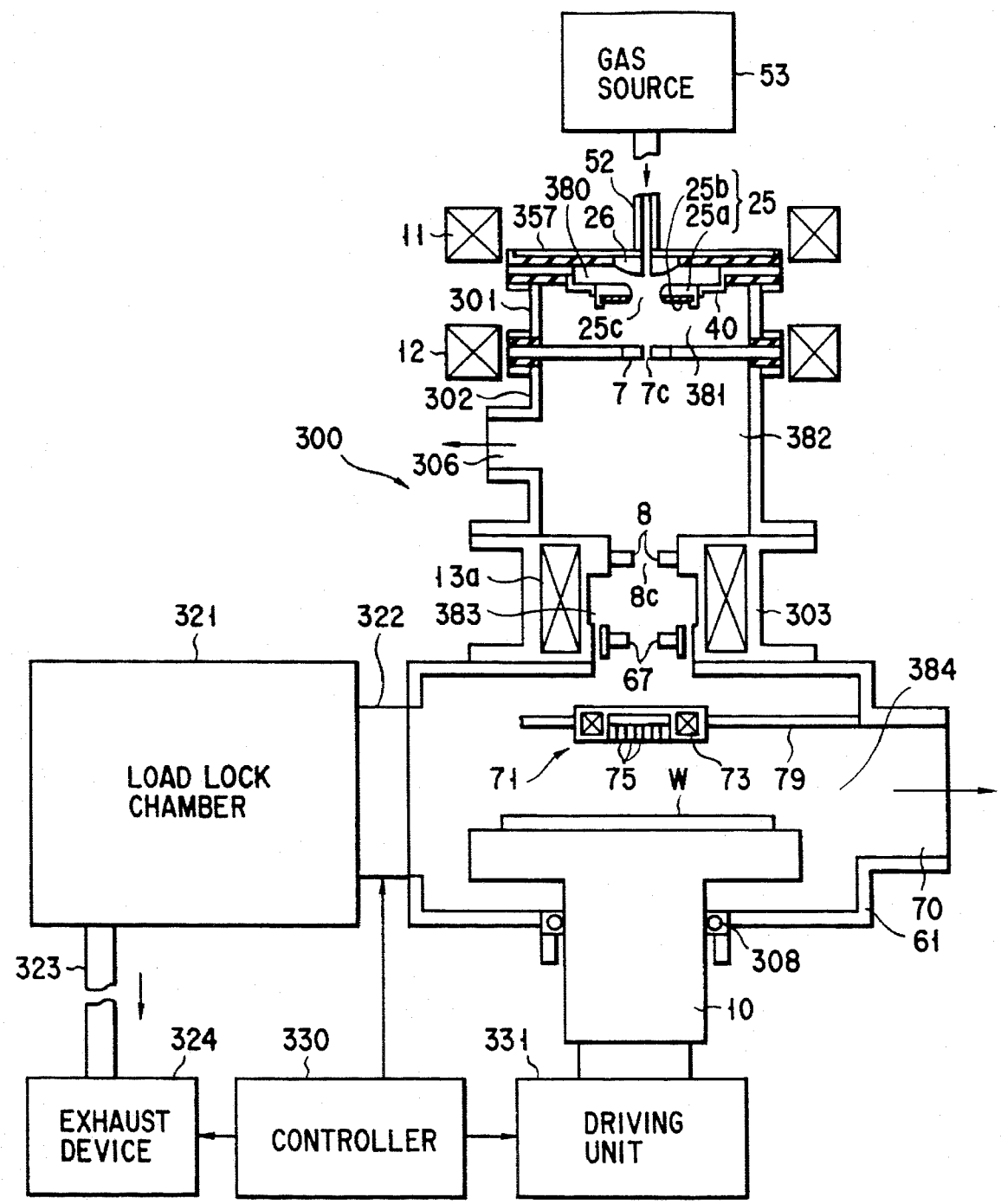
F I G. 6

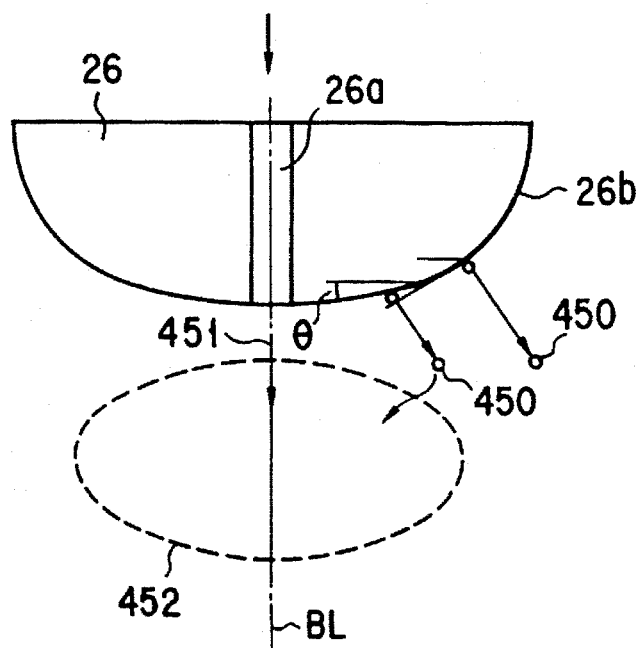
F I G. 11A
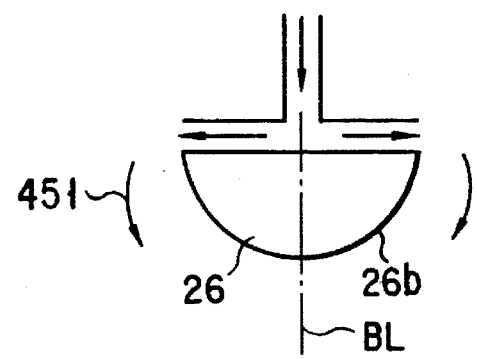
F I G. 11B
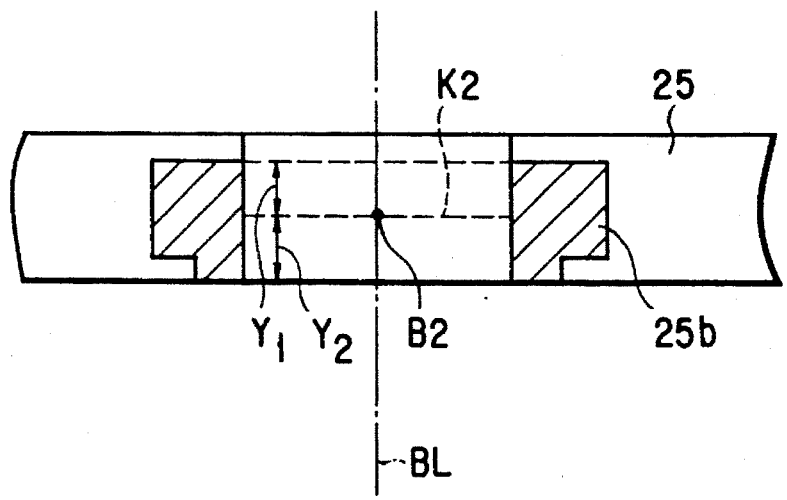
F I G. 12

ELECTRON BEAM EXCITED PLASMA SYSTEM

BACKGROUND OF THE INVENTION

1. Field of the Invention

The present invention relates to an electron beam excited plasma system for use in the manufacture of semiconductor devices or other types of devices.

2. Description of the Related Art

In an electron beam excited plasma system (hereinafter referred to as an EBEP system), a plasma is generated by exciting a reaction gas by means of electron beams. The plasma, thus generated, is utilized when a semiconductor wafer is subjected to etching, doping, oxide film formation or cleaning. Typical types of conventional EBEP systems are disclosed, for example, in Jpn. Pat. Appln. KOKAI Publications No. 63-190299, No. 1-105539, and No. 1-105540. The first KOKAI Publication No. 63-190299 discloses an EBEP system wherein a pair of electrodes are secured, with a spacer interposed therebetween. The other two KOKAI Publications disclose an EBEP system which comprises a deflecting electrode used for diffusing (or spreading) electron beams.

In these conventional EBEP systems, an electric discharge is produced between the tip end of a cathode and an anode or an intermediate electrode in the presence of argon gas, and electrons are extracted from the plasma generated by the electric discharge. The cathode is located on the central axis of the EBEP system, like the other electrodes. The cathode is made up of an initial discharge section formed of a high melting point metal, and a thermoelectron emission section formed of a lanthanum compound.

In a conventional EBEP system, the cathode is bombarded with ions at the time of electric discharge, resulting in the occurrence of sputtering. The metal atoms emitted during the sputtering (which will be hereinafter referred to as sputtering substances) may enter the reaction chamber and contaminate semiconductor wafers under treatment. Therefore, the convention EBEP system does not necessarily satisfy its requirements, such as fine working, little system damage, and high-speed plasma processing.

In the conventional EBEP system, the initial discharge section and the thermoelectron emission section are located at the tip end of the cathode and face the intermediate electrode. Due to this structure, the lanthanum compound of the thermoelectron emission section is chipped or partly lost when it is subjected to an impact caused by the bombardment of ions at the time (start up) of the actuation of the system.

The lanthanum compound cannot continuously emit thermoelectrons in a stable manner unless its temperature exceeds 1,000° C. This being so, the plasma generated by electric discharge is not very stable, and may be lost depending upon the conditions of the electric discharge. In addition, since a long time is required before the plasma becomes stable, the life of the ignition electrode is inevitably short.

SUMMARY OF THE INVENTION

Accordingly, an object of the present invention is to provide an EBEP system wherein a reaction chamber is kept clean, with the sputtering or chipping substances being prevented from entering the reaction chamber.

Another object of the present invention is to provide an EBEP system wherein the thermoelectron emission section of the cathode is not exerted with an impact and is therefore prevented from being chipped or partly lost.

Still another object of the present invention is to provide an EBEP system wherein the emission of electrons can become stable in a short time.

In one aspect of the present invention, there is provided an electron beam excited plasma system which extracts electron beams from a discharge plasma, accelerates the extracted electron beams to change a reaction gas into a plasma, and applies the plasma to a substrate, and which comprises:

a first auxiliary electrode for initial discharge;

an anode having an opening;

a cathode, having an opening and located between the anode and the first auxiliary electrode, for producing an initial discharge between the first auxiliary electrode and itself, and for producing a plasma-generating discharge between the anode and itself;

a second auxiliary electrode, having an opening and located between the cathode and the anode, for facilitating the generation of the discharge plasma between the cathode and the anode;

gas supply means for supplying a discharge plasma-generating gas into a region between the cathode and the anode; and magnetic field generating means for generating a magnetic field and for applying the magnetic field to the region between the cathode and the anode, such that a cusp magnetic field is generated in the vicinity of the cathode.

It is desirable that the cathode include: an ignition discharge section, formed of a high melting point metal and located in the vicinity of the first auxiliary electrode, for producing a discharge plasma between the cathode and the first auxiliary electrode; and a thermoelectron emission section, formed of a lanthanum compound and located in the vicinity of the second auxiliary electrode, for producing a discharge plasma between the cathode and the second auxiliary electrode.

It is also desirable that the high melting point metal of the ignition discharge section be one of tantalum, tungsten, molybdenum, and alloys of these metals. $LaB_6$ is the most suitable lanthanum compound of the thermoelectron emission section, but $LaS_2$, $La_2S_3$, $LaSe_2$, $La_2Se_3$ or $LaSi_2$ may be used in place of $LaB_6$.

In the system according to one aspect of the present invention, the diameter of the opening of the cathode is greater than that of the opening of the second auxiliary electrode. With this structure, there is little probability that the sputtering or chipping substances from the cathode will enter the reaction chamber, so that the reaction chamber is prevented from being contaminated. Moreover, since a cusp magnetic field is generated in the vicinity of the cathode, an electric discharge easily occurs between the cathode and the anode (or the internal electrode) even if the cathode is annular. As a result, the discharge gas is reliably changed into a plasma. This contributes greatly to improvement of the performance of the system; for example, fine working, little system damage, and high-speed plasma processing are enabled.

When the system according to one aspect of the present invention is actuated, the surface at one side of the high melting point metal of the cathode first causes an initial discharge with reference to an initial discharge electrode located opposite to the intermediate electrode, as a result of which the lanthanum compound at the other side of the cathode gradually increases in temperature and emits thermoelectrons. Since a plasma allowing a current to flow from the cathode to the intermediate electrode is generated, the position of the occurrence of the discharge moves from the region between the surface at one side of the cathode and the initial discharge electrode to the region between the lanthanum compound at the other side of the cathode and the intermediate electrode, and further to the region between the anode and the cathode. Between the anode and the cathode, the discharge is maintained in a stable manner. Therefore, the lanthanum compound of the thermoelectron emission section of the cathode is prevented from being exerted with an impact and therefore is not chipped or removed during the initial discharge of the system.

In the system according to one aspect of the present invention, moreover, the cathode is supported by means of a number of support arms in the discharge region. With this structure, the heat transmission from the cathode to an external structure (e.g., a container) is suppressed, and the cathode maintains a high temperature and reliably emits thermoelectrons.

In another aspect of the present invention, there is provided an electron beam excited plasma system which extracts electron beams from a discharge plasma, accelerates the extracted electron beams to change a reaction gas into a plasma, and applies the plasma to a substrate, and which comprises:

a first auxiliary electrode for initial discharge;

an anode having an opening;

a cathode, having an opening and located between the anode and the first auxiliary electrode, for producing an initial discharge between the first auxiliary electrode and itself, and for producing a plasma-generating discharge between the anode and itself;

a second auxiliary electrode, having an opening and located between the cathode and the anode, for facilitating the generation of the discharge plasma between the cathode and the anode;

gas supply means for supplying a discharge plasma-generating gas into a region between the cathode and the anode; and magnetic field generating means for generating a magnetic field and for applying the magnetic field to the region between the cathode and the anode, such that a cusp magnetic field is generated in the vicinity of the cathode, the cathode including;

a small-inner-diameter ring portion formed of a high melting point metal and located in the vicinity of the first auxiliary electrode; and a large-inner-diameter ring portion formed of a high melting point metal, located in the vicinity of the second auxiliary electrode, and having an inner diameter greater than that of the small-inner-diameter ring portion, and the large-inner-diameter ring portion being coaxial with the small-inner-diameter ring portion and spaced therefrom.

In the system according to the second aspect of the present invention, the large-inner-diameter ring portion and the small-inner-diameter ring portion are spaced from each other, and the cathode has an increased total surface area. With this structure, a very large number of electrons (thermoelectrons and other electrons) are emitted from the groove-like depressed portion located between the large-inner-diameter ring portion and the small-inner-diameter ring portion. In other words, since the electron emission area of the cathode is wide in comparison with the area of the plasma interface from which electrons are extracted, a large number of electrons are emitted from the cathode even when the temperature of the cathode is comparatively low (e.g., 1,000° C. or lower). Therefore, the discharge plasma is stabilized in a short time from the actuation of the system. When the temperature of the cathode increases, larger number of electrons are emitted from the cathode in a stable manner.

The small-inner-diameter ring portion may be easily consumed since it is used not only for the initial discharge but also for the electron emission. In addition, the small-inner-diameter ring portion is thin so that its temperature can easily increase. Since, therefore, the small-inner-diameter ring portion does not withstand long use, it is desired that the small-inner-diameter ring portion be removable from the holder member.

The accompanying drawing, which is incorporated in and constitutes a part of the specification, illustrates a presently preferred embodiment of the invention and, together with the general description given above and the detailed description of the preferred embodiment given below, serves to explain the principles of the invention.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic model diagram showing a discharge plasma-generating electrode, a discharge plasma-generating circuit, and a magnetic field-generating solenoid;

FIG. 4 is a schematic diagram showing a longitudinal section of the entire EBEP system according to the second embodiment of the present invention;

FIG. 6 is a schematic diagram showing a longitudinal section of the entire EBEP system according to the third embodiment of the present invention;

FIG. 11A is a schematic diagram showing how a gas flows in the vicinity of an initial discharge electrode and illustrating the relationships between streams of a plasma-generating gas and sputtering substances;

FIG. 11B is a schematic diagram showing how a gas flows in the vicinity of another type of initial discharge electrode; and FIG. 12 is a partially sectional view showing part of a cathode.

DETAILED DESCRIPTION OF THE PREFERRED EMBODIMENTS

Various embodiments of the electron beam excited plasma system of the present invention will be described with reference to the accompanying drawings. In the description below, reference will be made to the case where a semiconductor wafer is subjected to plasma etching.

Figure 1:
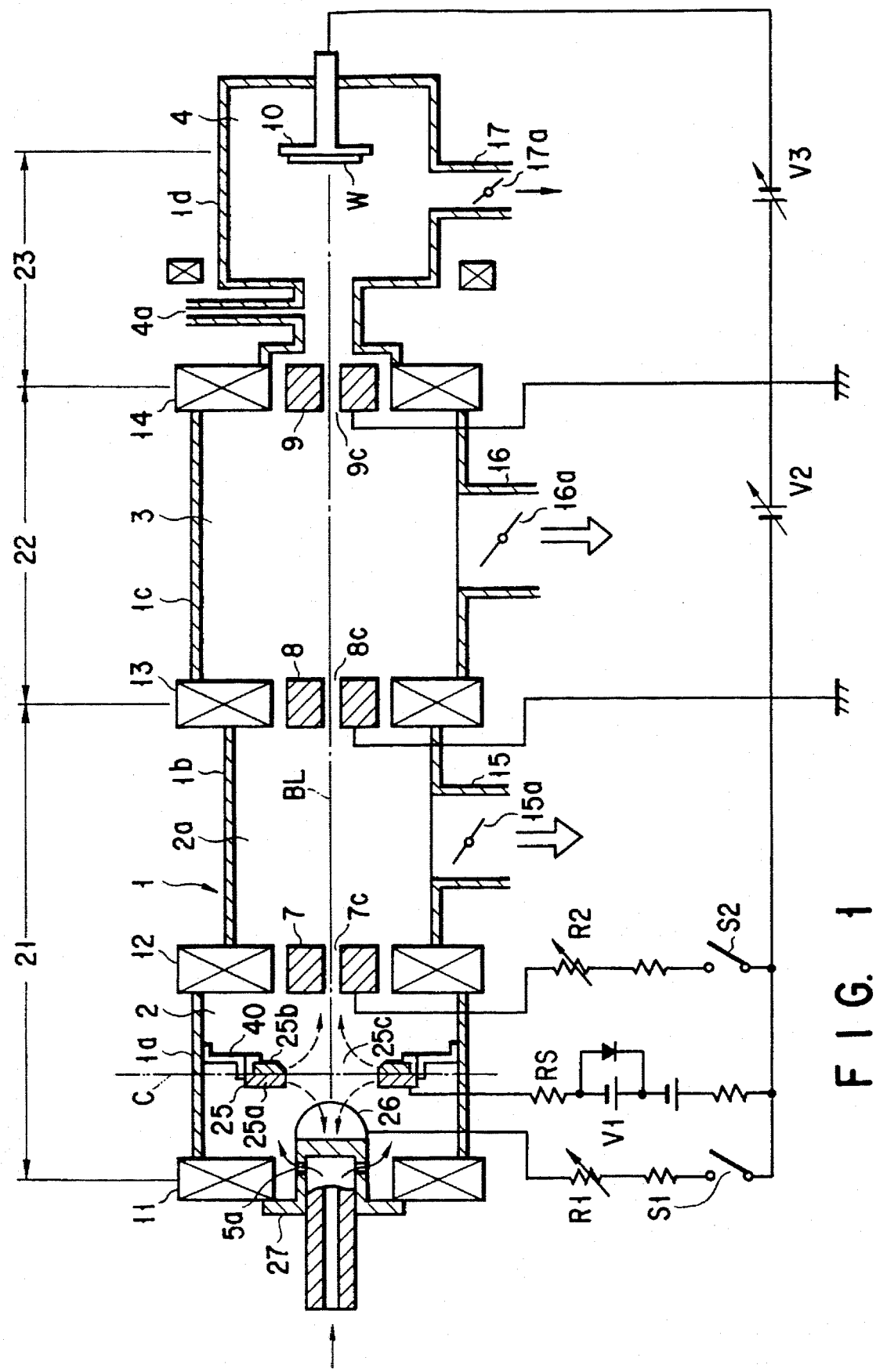
FIG. 1 is a schematic diagram showing a longitudinal section of the entire EBEP system according to the first embodiment of the present invention.

As shown in FIG. 1, a plasma etching apparatus 1 is a sealed container and is made up of cylindrical casing blocks 1a, 1b, 1c and 1d formed of stainless steel. The casing blocks 1a, 1b, 1c and 1d are coaxially coupled together. The rear, intermediate, and front portions of the apparatus 1 constitute a plasma generating chamber 2, an electron beam-accelerating chamber 3, and a reaction chamber 4, respectively.

A ring-like cathode 25 is provided inside the plasma generating chamber 2, and an initial discharge electrode (first auxiliary electrode) 26 is located on the rear side of the cathode 25. An intermediate electrode (second auxiliary electrode) 7 is located on that side of the cathode which is opposite to the initial discharge electrode 26, i.e., on the front side of the cathode. An anode 8 is located on the front side of the intermediate electrode 7. The initial discharge electrode 26 is supported by means of a cap-like support member 27, and a gas introducing hole 5a, from which a plasma-generating discharge gas is introduced into the interior of the apparatus 1, is defined in the periphery of that cap-like support member 27.

The intermediate electrode 7 and the anode 8 have small-diameter electron beam passage openings 7c and 8c in their centers. The intermediate electrode 7, the anode 8 and the initial discharge electrode 26 are located on the central axis (electron beam line) BL of the apparatus 1. A discharge plasma region 21 is defined between the rear region of the plasma generating chamber 2 and the anode 8. The initial discharge electrode (first auxiliary electrode) 26, the intermediate electrode (second auxiliary electrode) 7 and the anode 8 are located in this plasma generating chamber 2.

Annular coils 11, 12 and 13, used for generating a magnetic field to be described later, are provided around the initial discharge electrode 26, the intermediate electrode 7 and the anode 8, respectively. The plasma generating chamber 2 includes an intermediate chamber 2a. An exhaust duct 15, in which a valve 15a is provided, is led out of the intermediate chamber 2a, and is connected to a vacuum pump (not shown) so as to maintain the intermediate chamber 2a at a predetermined vacuum pressure.

An electron accelerating electrode 9 is located in the front region of the electron beam-accelerating chamber 3. Like the intermediate electrode 7 and the anode 8 mentioned above, the electron accelerating electrode 9 has a small-diameter electron beam passage opening 9c in the center thereof and is located on the central axis BL of the apparatus 1. An electron accelerating region is defined between the anode electrode 8 and the electron accelerating electrode 9.

An annular coil 14, used for generating a magnetic field, is provided around the electron accelerating electrode 9. An exhaust duct 16, in which a damper 16a is provided, is led out of the electron beam accelerating chamber 3, and is connected to a vacuum pump (not shown).

A wafer holder 10 for holding a semiconductor wafer W is provided in the reaction chamber 4. A gas introducing pipe 4a, from which a reaction gas (etching gas) is introduced into the reaction chamber 4, is provided for the reaction chamber 4. An exhaust duct 17, in which a damper 17a is provided, is led out of the reaction chamber, and is connected to a vacuum pump (not shown).

The inner diameter of the cathode 25 is about 20 mm, and is greater than those of the other electrodes 7, 8 and 9. The cathode 25 is supported by a number of support arms 40 such that the center of its hole 25c is on the central axis BL. The means for supporting the cathode 25 is not limited to the support arms 40; it may be a ring-like plate. It is preferable that the support arms 40 be as thin as possible, since thin support arms 40 reduces the heat transmission from the cathode 25 to casing block 1a and enables the cathode 25 to quickly increase in temperature.

One side of the cathode 29 (i.e., the axially rear side of the cathode 25) constitutes an ignition section 25a, and this section is formed of tantalum. The other side of the cathode 25 (i.e., the axially front side of the cathode 25) constitutes a thermoelectron emission section 25b, and this section is formed of $LaB_6$.

As described above, the intermediate electrode 7 is located on the axially front side of the cathode 25, and the anode 8 is located on the axially front side of the intermediate electrode 7. The initial discharge electrode 26 is located on the axially rear side of the cathode 25. The initial discharge electrode 26 faces the ignition section 25a of the cathode 25, and it has a gently-curved surface and looks like a dome.

Figure 2:
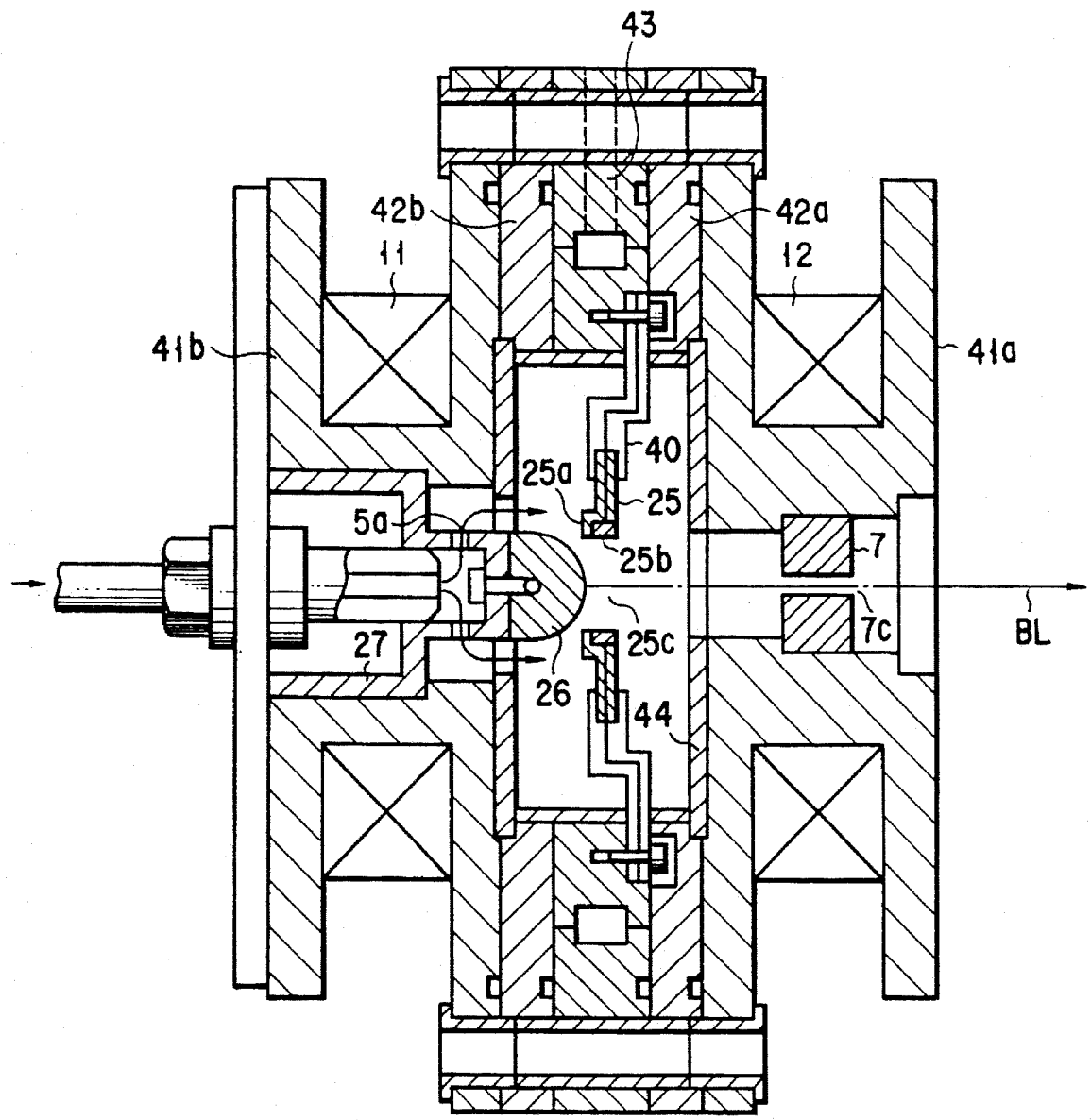
FIG. 2 is a longitudinal sectional view of a discharge unit employed in the first embodiment.

As shown in FIGS. 2 and 3, a pair of solenoids 11 and 12 (annular electromagnetic coils) are symmetrically arranged with reference to the cathode 25 and are away from the thickness center C of the cathode 25 by the same distance. The solenoid 11 located on the rear side of the cathode 25 generates a magnetic field which is directed backward from the periphery of the cathode 25 toward the central axis BL of the apparatus 1. On the other hand, the solenoid 12 located on the front side of the cathode 25 generates a magnetic field directed forward from the periphery of the cathode 25 toward central axis BL of the apparatus 1. These two magnetic fields, generated in different directions, are synthesized and a cusp magnetic field is produced thereby. The cathode 25 is located in the region where the cusp magnetic field is generated.

Resistor $R_1$ is provided for the circuit which connects the cathode 25 and the initial discharge electrode 26 together, and resistor $R_2$ is provided for the circuit which connects the cathode 25 and the intermediate electrode 7 together. The resistances of these resistors $R_1$ and $R_2$ satisfy the following relationships (1) and (2):

$$R_1 > R_2 > R_p \qquad (1)$$

$$R_1 - R_2 >> R_p \qquad (2)$$

where $R_p$ is an impedance of a discharge plasma.

A stabilizing resistor Rs is connected to the cathode 25.

As shown in FIG. 2, the structure between the rear end of the plasma generating chamber 2 and the intermediate electrode 7 is assembled as one unit. Cylindrical casing blocks 41a and 41b are formed of stainless steel, and each blocks 41a and 41b has flanges. Insulating rings 42a and 42b and water-cooled jacket 43 are located between the cylindrical casing blocks 41a and 41b. The insulating rings 42a and 42b, water-cooled jacket 43, and the cylindrical casing blocks 41a and 41b jointly define a space, and a heat-resistant wall member 44 formed of ceramics is provided on the structures defining that space. The cathode 25, supported by means of support arms 40, is located in the substantially central region of the internal space defined by the heat-resistant wall member 44. The internal electrode 7 is fitted and secured in casing block 41a. The cap-like support member 27 is fitted in the rear-side casing block 41b, and the initial discharge electrode 26 is coupled to the tip end of the cap-like support member 27. A gas introducing hole 5a is formed in the support member 27, and argon gas is introduced into the interior of the plasma generating chamber 2 from a gas supply source (not shown) by way of the gas introducing hole 5a. The solenoids 11 and 12 (electromagnetic coils) are located around the casing blocks 41a and 41b.

A description will now be given of the operation of the EBEP system mentioned above.

First of all, a cusp magnetic field is generated in the region where the cathode 25 is located by means of the solenoids 11 and 12. The intensity of the cusp magnetic field is about 150 gauss in the vicinity of the cathode 25 in the present embodiment; it is desired that this intensity be within the range of 100 to 200 gauss. In addition, an axial magnetic field directed forward from the intermediate chamber 2a to the electron beam accelerating chamber 3 is generated by means of the solenoids 13 and 14. The intensity of the axial magnetic field directed forward is about 400 gauss in the electron beam accelerating chamber 3 in the preset embodiment; it is desired that this intensity be within the range of 300 to 500 gauss.

Then, the plasma generating chamber 2, the electron beam-accelerating chamber 3 and the reaction chamber 4 are exhausted of gases such that these chambers have their predetermined internal pressures. For example, the plasma generating chamber 2 is made to have an internal pressure of about 1 Torr, the intermediate chamber 2a is made to have an internal pressure of about 6 milli-Torr (which should be in the range of 3 to 8 milli-Torr), the beam accelerating chamber 3 is made to have an internal pressure of about 1 milli-Torr (which should be in the range of 0.5 to 3 milli-Torr), and the reaction chamber 4 is made to have an internal pressure of about 1 milli-Torr (which should be in the range of 0.5 to 3 milli-Torr).

In this condition, voltage $V_1$ is applied between the cathode 25 and the initial discharge electrode 26 (the first auxiliary electrode). Voltage $V_1$ is also applied between the intermediate electrode 7 (the second auxiliary electrode) and the anode 8. Voltage $V_1$, applied at the time of actuation of the system, is of the order of hundreds of volts. Since the distance between the ignition section 25a and the first auxiliary electrode 26 is shorter than the distance between the thermoelectron emission section 25b and the second auxiliary electrode 7, an electrical discharge first occurs between the ignition section 25a and the first auxiliary electrode 26 (initial discharge).

As a result of the initial discharge, the thermoelectron emission section 25b is heated, and a discharge plasma is generated between the thermoelectron emission section 25b and the second auxiliary electrode 7. It should be noted that the resistance of resistor R1 is higher than that of resistor R2. Therefore, after the discharge plasma is generated between the thermoelectron emission section 25b and the second auxiliary electrode 7, the initial discharge between the ignition section 25a and the first auxiliary electrode 26 disappears. The thermoelectrons emitted from the cathode 25 move along the line of magnetic force of the cusp magnetic field. After the discharge plasma is stabilized, switches S1 and S2 are turned off, and voltage $V_1$ is lowered to tens of volts. Switches S1 and S2 need not be employed if the resistance of resistor R1 is far higher than that of resistor R2. In addition, if the resistances of resistors R1 and R2 are set far higher than the impedance Rp of the plasma, as expressed in formulas (1) and (2) set forth above, an electric discharge between the cathode 25 and the second auxiliary electrode 7 or the anode 8 can easily occur even if switches S1 and S2 are not employed.

The relationships between a discharge plasma and a magnetic field will be described, with reference to FIG. 3. The center magnetic field generated by means of solenoid 11 and the center magnetic field generated by means of solenoid 12 are directed in the opposite directions. These two magnetic fields jointly produce a cusp magnetic field, and the center of this cusp magnetic field is widthwise central line C of the cathode 25. Due to this cusp magnetic field, an electric discharge from the cathode 25 is facilitated.

When voltage $V_2$ is applied across the electron accelerating electrode 9 of the beam accelerating chamber 3, the thermoelectrons are pulled and enter the beam accelerating chamber 3. Inside the beam accelerating chamber 3, the thermoelectrons are accelerated and enter the reaction chamber 4. In the reaction chamber 4, the chlorine gas ($Cl_2$) and argon gas (At) are irradiated with electron beams. Since the gases are ionized or excited thereby, a high-density plasma is generated inside the reaction chamber 4. When the wafer holder 10 is applied with voltage $V_3$, the reactants (e.g., a reactive gas, ions and electrons) react with the wafer W, and the surface of the wafer w is etched thereby.

In the above embodiment, the initial discharge is produced by the ignition section 25a formed of a metal, not by the thermoelectron emission section 25b formed of $LaB_6$. Therefore, the thermoelectron emission section 25b is not exerted with an impact and is therefore prevented from damaged or chipped. In addition, since the first auxiliary electrode 26 serves as an anode when the system is actuated, the sputtering due to ions do not occur. Moreover, since the hole 25c of the cathode 25 is very large, there is a remote likelihood that sputtering substances from the cathode 25 will enter the reaction chamber 4. In a vertical-type plasma apparatus whose central axis (electron beam line) BL is vertical, the sputtering substances from the cathode or other chips fall directly into the reaction chamber. This can be reliably prevented in the present invention.

Figure 5:
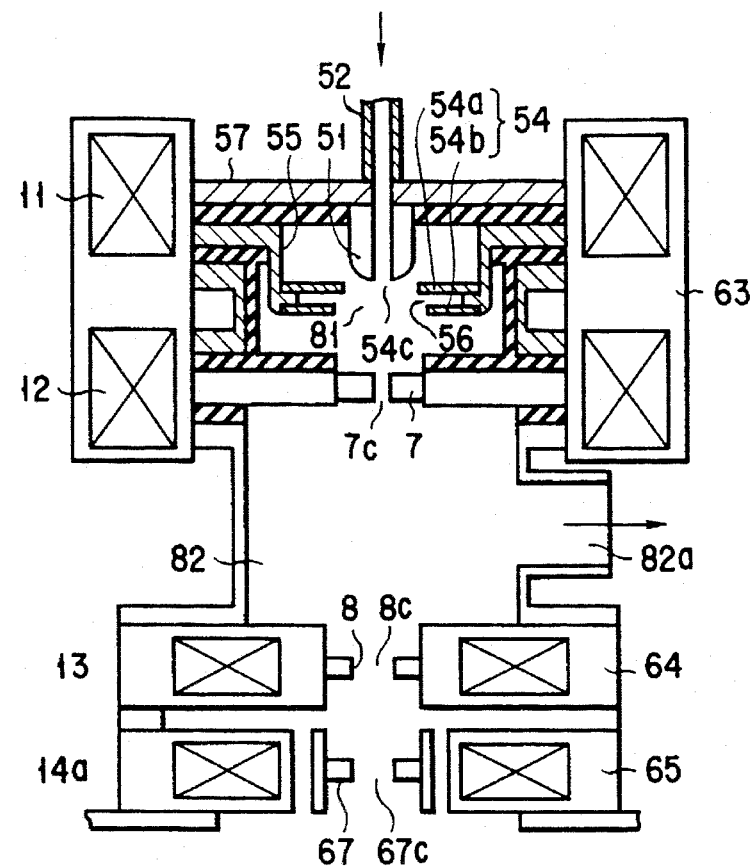
FIG. 5 is a partially-enlarged sectional view in which the initial discharge region and discharge plasma region of the EBEP system of the second embodiment are depicted in an enlarged scale.
Figure 7:
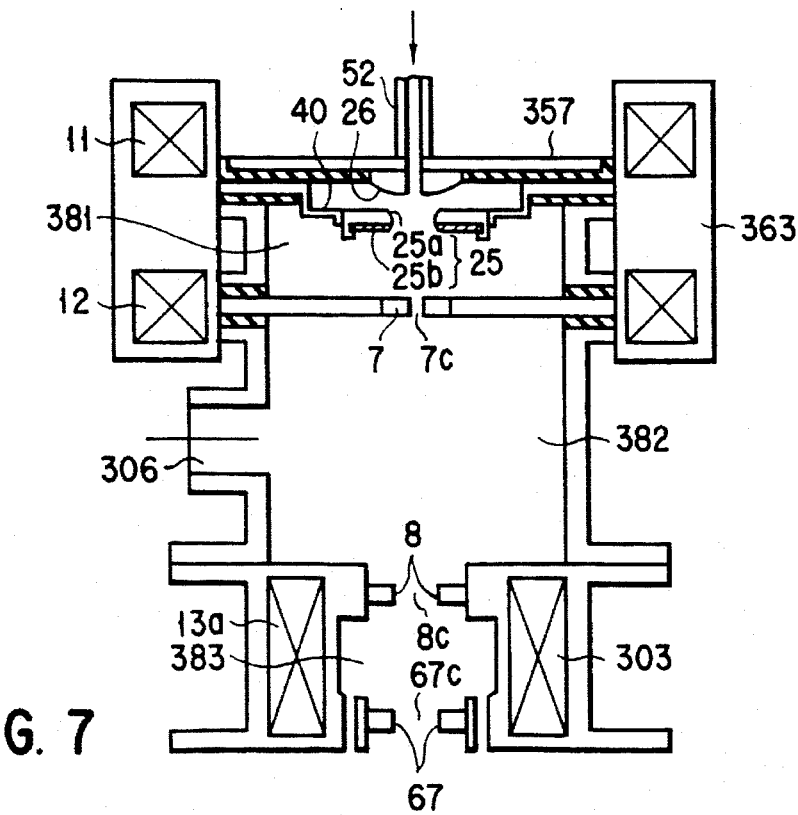
FIG. 7 is a partially-enlarged sectional view in which the initial discharge region and discharge plasma region of the EBEP system of the third embodiment are depicted in an enlarged scale.

The second embodiment of the present invention will be described, with reference to FIGS. 4 and 5. Of the structural elements or features of the second embodiment, those which are similar to the first embodiment described above will not be explained for the sake of simplicity.

The EBEP system 50 of the second embodiment is featured in that the cathode 54 it employs has a special shape. In the second embodiment, the cathode 54 is secured to a cover 57, and the rear side of the cathode 54 faces an initial discharge region and the front side thereof faces a first discharge plasma region 81. A pair of solenoids 11 and 12 are held by a holder 63, such that a cusp magnetic field is generated in the region where the cathode 54 is present.

The cathode 54 comprises a small-inner-diameter ring 54a in the rear thereof, and a large-inner-diameter ring 54b in the front thereof. The shortest distance between the small-inner-diameter ring 54a and a first auxiliary electrode 51 is about 4.6 mm in the embodiment; it is desired that the distance be in the range of 3 to 6 mm. An initial discharge is produced by applying a voltage between ring 54a and the first auxiliary electrode 51 by means of the DC power supply V1 of circuit 91. The shortest distance between the large-inner-diameter ring 54b and a second auxiliary electrode 7 is about 12 mm in the embodiment; it is desired that the distance be in the range of 6 to 50 mm. A discharge for emitting electrons is produced by applying a voltage between ring 54b and the second auxiliary electrode 7 by means of the DC power supply V1 of the circuit 91. In the initial stage electrons are emitted from the radially inner portions of the rings 54a and 54b toward the second auxiliary electrode 7, and in the subsequent stage they are emitted from the radially inner portions of the rings 54a and 54b toward an anode 8.

The small-inner-diameter ring 54a and the large-inner-diameter ring 54b are detachably held by a conductive holder 55 and are electrically connected to each other. The conductive holder 55 is electrically insulated from both the first and second auxiliary electrodes 51 and 7 by means of insulating members. The small-inner-diameter ring 54a is thinner than the large-inner-diameter ring 54b. It is desired that the small-inner-diameter ring 54a have a thickness in the range of 0.5 to 2 mm and that the large-inner-diameter ring 54b have a thickness in the range of 2 to 6 mm. It is also desired that the inner diameter of the small-inner-diameter ring 54a be in the range of 5 to 25 mm and that the inner diameter of the large-inner-diameter ring 54b be in the range of 10 to 30 mm. The small-inner-diameter ring 54a and the large-inner-diameter ring 54b are coaxial and spaced from each other. The gap 56 between the small-inner-diameter ring 54a and the large-inner-diameter ring 54b is about 1.5 mm in the embodiment; it is desired that the gap 56 be in the range of 1 to 6 mm. The cathode 54 is made of tantalum or tantalum-based alloy. The first auxiliary electrode 51 and the second auxiliary electrode 7 are made of molybdenum or molybdenum-based alloy.

Argon gas is introduced from a gas source 53 into the initial discharge region 80 by way of a passage 52. The passage 52 penetrates the cover 57 and is open at the tip end of the first auxiliary electrode 51. The argon gas flows from the initial discharge region 80 into the first discharge plasma region 81 by way of a cathode hole 54c. The cathode electrode 54 is located between the initial discharge region 80 and the first discharge plasma region 81. The second auxiliary electrode 7 is located between the first discharge plasma region 81 and a second discharge plasma region 82.

The second discharge plasma region 82 is larger in capacity than the first discharge plasma region 81. A gas is exhausted from the second discharge plasma region by way of an exhaust passage 82a.

Cylinder units 64 and 65, which incorporates an anode 8 and an accelerating chamber 67, respectively, are located in an accelerating chamber 83. The anode 8 is backed up by electromagnetic coil 13, while the accelerating electrode 67 is backed up by electromagnetic coil 14a. The anode 8 and the accelerating electrode 67 are connected to an electron accelerating circuit 92. Voltage $V_2$ is applied to this circuit 92 by a DC power supply.

A wafer holder 10 and unit holders 71 and 95 are arranged in a reaction region 84. A chamber 61 has a gas introducing passage 61a and an exhaust passage 70. Through the gas introducing passage 61a, an etching gas (a halogen gas, such as a chlorine gas) is introduced into the reaction region 84. The gas in the reaction region 84 is exhausted through the exhaust passage 70.

The wafer holder 10 has an electrostatic chuck mechanism (not shown) for holding a wafer W, and is connected to an RF circuit 93. The wafer W held by the wafer holder 10 faces unit holder 71. Unit holder 71 is supported and secured to the chamber 61 by means of a support member 79. Unit holder 71 incorporates a ring-like electromagnetic coil 73, which generates a magnetic field for diffusing (or spreading) electron beams.

Unit holder 95 has an electron leading-in means 96. The electron leading-in means 96 includes two electromagnetic coils 96a and 96b which are different in size and coaxial with each other. The electromagnetic coils 96a and 96b generate magnetic fields different in direction, so as to lead electrons into the periphery of the wafer w.

In the EBEP system of the second embodiment, a large number of electrons are stably generated from the gap 56 between the small-inner-diameter ring 54a and the large-inner-diameter ring 54b. This is because the cathode 54 has a wide surface area, due to the provision of the rings 54a and 54b.

The small-inner-diameter ring 54a is easily consumed since it serves not only as a plasma discharge electrode for electron emission but also as an initial discharge electrode. Since, therefore, the small-inner-diameter ring 54a has a life shorter than that of the large-inner-diameter ring 54b, it has to be frequency replaced with a new one. Therefore, the small-inner-diameter ring 54a is designed such that it is easily detachable from the holder 55.

The third embodiment of the present invention will now be described, with reference to FIGS. 6–9. Of the structural elements or features of the third embodiment, those which are similar to the first or second embodiment described above will not be explained for the sake of simplicity.

As shown in FIG. 6, the EBEP system 300 of the third embodiment is a vertical type, wherein electron beams are introduced from discharge plasma regions 381 and 382 (which are defined in the upper portion of the system) into a reaction region 384 by way of an accelerating region 383. The upper portion of the EBEP system 300 is made up of three cylinders, namely, first, second and third cylinders 301, 302 and 303, while the lower portion thereof is made up of a reaction chamber 61 and a load lock chamber 321. The first cylinder 301 is covered with an upper cover 357, and a first auxiliary electrode 26 is attached to the inner face of the upper cover 357. A gas supply source 52 is open in the tip end of the first auxiliary electrode 26, and argon gas is introduced into an initial discharge region 380 from a gas source 53.

A cathode 25 is supported and secured to the first cylinder 301 by means of a number of arm holders 40. The cathode 25 comprises an ignition section 25a and an electron emission section 25b. The ignition section 25a is formed of tantalum or tantalum alloy and located close to the first auxiliary electrode 26 inside the initial discharge chamber 380. The electron emission section 25b is formed of $LaB_6$ and located close to a second auxiliary electrode 7 inside the first initial plasma region 381. A DC circuit, which is similar to that of the first embodiment, is connected to the ignition section 25a and the electron emission section 25b.

The shortest distance between the ignition section 25a and the first auxiliary electrode 26 is desirably in the range of 4 to 5 mm, and the shortest distance between the electron emission section 25b and the second auxiliary electrode 7 is desirably within the range of 10 to 50 mm. The central opening 25c of the cathode 25 is greater in diameter than the central opening 7c of the second auxiliary electrode 7. Central hole 25c is desirably within the range of 10 to 30 mm, and central opening 7c is desirably within the range of 2 to 6 mm. The diameter of the anode opening 8c can be selected by those skilled in the art. As shown in FIG. 6, the size of the diameter 8c can be between that of the opening 7c and the opening 25c (see also FIG. 3).

A pair of solenoids 11 and 12 are provided such that they generate a cusp magnetic field in the region where the cathode 25 is present. The solenoids 11 and 12 are held by means of a unit member 363.

The second discharge plasma region 382 communicates with the first discharge plasma region 381 by way of the central opening 7c of the second auxiliary electrode 7. The second cylinder 302 is provided with an exhaust passage 306 communicating with an exhausting device (not shown), and the gas in the second discharge plasma region 382 is exhausted through the exhaust passage 306.

The accelerating region 383 communicates with the second discharge plasma region 382 by way of the central opening 8c of an anode 8. An electron accelerating electrode 67 is located in the lower region of the accelerating region 383. The anode 8 and the electron accelerating electrode 67 are backup up by a single electromagnetic coil 13a.

The gas in the reaction region 384 is exhausted from a passage 70 by means of an exhaust device. A reactive gas from a gas source 78 is supplied into the reaction region 384 by way of a large number of passages 75 of a gas shower unit 71. A susceptor 10 is located at the bottom of the reaction chamber 61, and a wafer W is placed on top of the susceptor 10. The susceptor 10 comprises an electrostatic chuck for holding the wafer W by suction. The lower end of the susceptor 10 is coupled to the shaft of a driving unit 331, and the susceptor 10 is vertically movable and rotatable by the driving unit 331. A bearing 308 is located between the circumferential wall of the lower portion of the susceptor 10 and the wall of the chamber 61.

A load lock chamber 321 is coupled to one side of the reaction chamber 61, with a gate valve interposed therebetween. A wafer transfer device (not shown) is provided inside the load lock chamber 321, so as to transfer a wafer W from a cassette (not shown) onto the susceptor 10. The load lock chamber 321 communicates with an exhaust device 324 by way of a pipe 323. The gate valve 322, the exhaust device 324 and the driving unit 331 are individually controlled by a controller 330.

Figure 8:
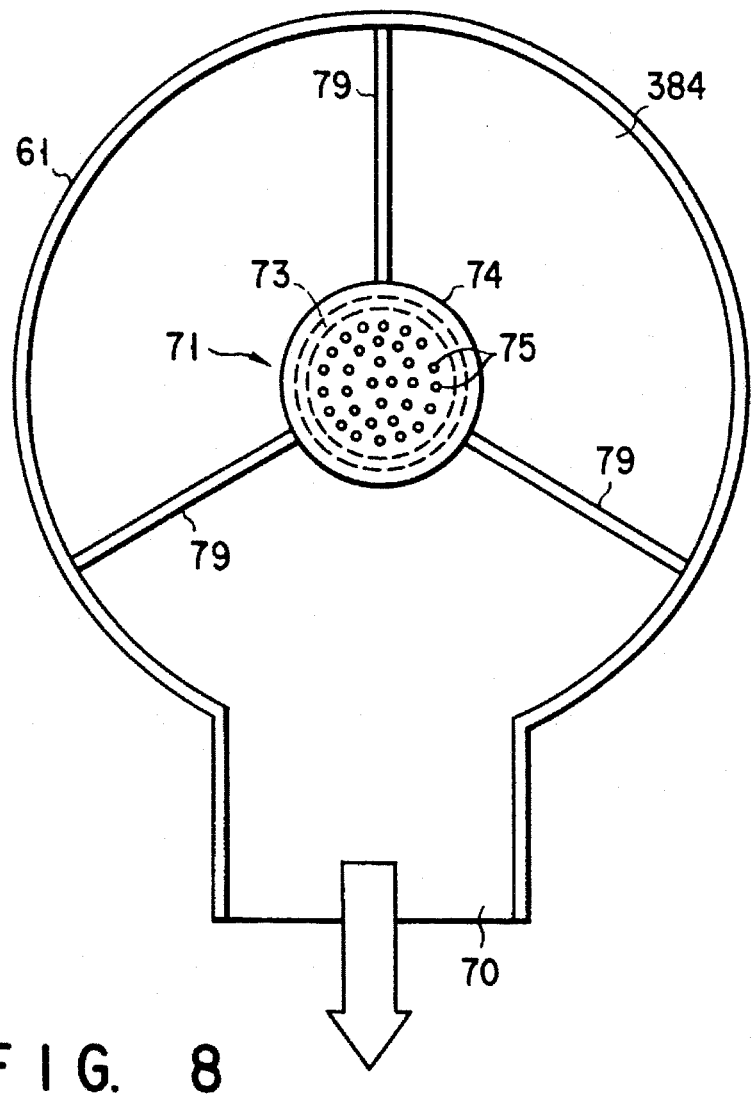
FIG. 8 is a plan view of a gas shower unit located in a reaction chamber.
Figure 9:
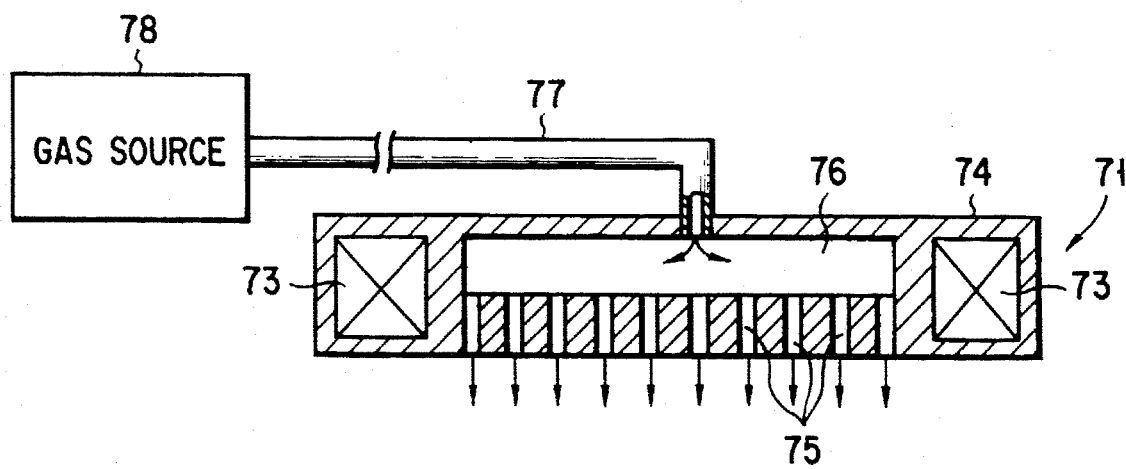
FIG. 9 is a longitudinal sectional view of the gas shower unit.

The gas shower unit 71 provided in the reaction chamber 61 is in the form of a disk. As shown in FIG. 8, the gas shower unit 71 is supported by three arms 79 such that it faces the wafer W placed on the susceptor 10. As shown in FIG. 9, an electromagnetic coil 73 is incorporated in the case 74 of the gas shower unit 71. A gas reservoir 76 and a large number of passages 75 are formed in the radially inner region of the electromagnetic coil 73. The upper region of the gas reservoir 76 communicates with the gas source 78 by way of a pipe 77, while the lower region thereof communicates with the passages 75. When a gas is supplied into the gas reservoir 76, it is jetted into the reaction region 384 from the passages 75.

In the vertical type EBEP system of the third embodiment, the opening 25c of the cathode 25 is far greater than the opening 7c of the second auxiliary electrode. Therefore, the sputtering substances from the cathode or other chips are prevented from falling directly into the reaction chamber 61, so that the wafer W in the reaction chamber 61 is not contaminated.

In addition, the third embodiment employs a load lock chamber 321. With this structure, the wafer W in the reaction chamber 61 can be reliably prevented from being contaminated.

Moreover, the third embodiment employs a gas shower unit 71 by which a reactive gas is reliably supplied into the region in the vicinity of the wafer W. With this structure, the etching rate of the wafer W can be enhanced.

The fourth embodiment of the present invention will be described with reference to FIGS. 10–12. Of the structural elements or features of the fourth embodiment, those which are similar to the first, second or third embodiment described above will not be explained for the sake of simplicity.

Figure 10:
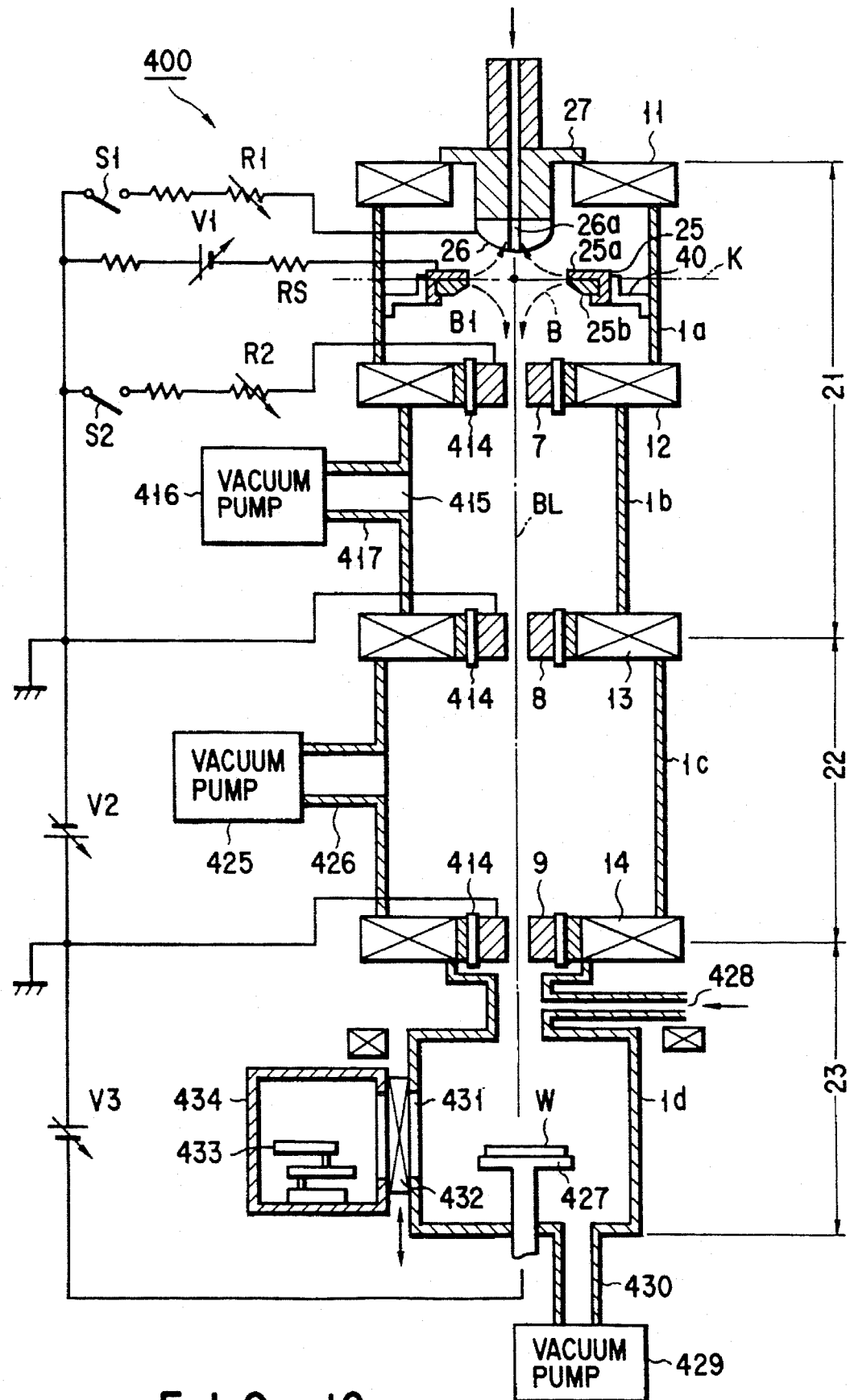
FIG. 10 is a schematic diagram showing a longitudinal section of the entire EBEP system according to the fourth embodiment of the present invention.

As shown in FIG. 10, the EBEP system 400 of the fourth embodiment is a vertical type. The front region of a discharge plasma region 21 is defined by a chamber 1a, and a cathode 25 and first and second auxiliary electrodes 26 and 27 are provided inside the chamber 1a. The cathode 25 is secured to the frame of the chamber 1a by means of a support member 40. The cathode 25 is shaped like a ring and has an outer diameter of about 20 mm in the embodiment. It is desired that the outer diameter of the cathode 25 be in the range of 15 to 50 mm. The cathode 25 is made up of an ignition section 25a and a thermoelectron emission section 25b. The ignition section 25a is formed of tantalum (Ta), and the thermoelectron emission section 25b is formed of $LaB_6$ (lanthanum boride). The support member 40 and the frame 1a are formed of stainless steel.

The first auxiliary electrode 26 is formed of a high melting point metal (e.g., molybdenum) and located close to the ignition section 25a of the cathode 25. A gas introducing hole 26a is formed in the center of the first auxiliary electrode 26, and argon gas used for producing an initial discharge plasma is supplied from the gas introducing port 26a.

First and second solenoids 11 and 12, used for jointly generating a cusp magnetic field, are provided around that the radially outer on the around the chamber 1a. The cusp magnetic field is generated such that the magnetic intensity is zero at the intersection $B_1$ between the central axis (electron beam line) BL and the plane in which the ignition section 25a and the thermoelectron emission section 25b are stacked upon each other.

The rear region of the discharge plasma region 21 is defined by a chamber 1b, and a ring-like second auxiliary electrode 7 and an anode 8 are provided inside the chamber 1b. In the fourth embodiment, the inner diameter of the second auxiliary electrode 7 is about 2.8 mm, and the inner diameter of the anode 8 is about 8 mm. It is desirable that the second auxiliary electrode 7 and the anode 8 have inner diameters in the range of 2 to 10 mm and be formed of a high melting point metal, such as molybdenum. A solenoid 13 is provided around the anode 8. The solenoid 13 generates a magnetic field such that the magnetic intensity in the vicinity of the center hole of the anode 8 is about 400 gauss. It is desired that the magnetic intensity be within the range of 10 to 500 gauss.

Chamber 1b has an opening 415, and this opening 415 communicates with a vacuum pump 416 by way of an exhaust pipe 417. The vacuum pump 416 is controlled by a controller (not shown), so that the internal pressure of chamber 1b is in the range of 1 to 100 milli-Torr. The internal pressures of this range correspond to the pressures of 0.1 to 10 Torr in the vicinity of the cathode 25. For example, when the internal pressure of chamber 1b is set to be 4 milli-Torr, the pressure in the vicinity of the cathode 25 is 0.4 Torr.

Electron accelerating region 22 is defined by a chamber 1c, and an electron accelerating electrode 9 is provided inside the chamber 1c. The electron accelerating electrode 9 has a ring shape and has an inner diameter of 10 mm. It is desired that the inner diameter of the electron accelerating electrode 9 be in the range of 2 to 15 mm. A solenoid 14 is provided around the electron accelerating electrode 9 so as to produce a magnetic field of about 400 gauss in the vicinity of the central hole of the electron accelerating electrode 9. The second auxiliary electrode 7, the anode 8 and the electron accelerating electrode 9 are supported by frames (not shown) by means of a number of members 414.

The gas in chamber 1c is exhausted through an exhaust pipe 426 by means of a vacuum pump 425. In general, the internal pressure in chamber 1c is set to be lower than that in chamber 1b.

A gas introducing pipe 428 is provided in the vicinity of the inlet of a plasma processing region 23, and an etching gas is introduced into the plasma processing region 23 from the gas introducing pipe 428. $Cl_2$ gas is used as the etching gas. A wafer holder 427 is provided inside the chamber 1d, and a wafer transfer device 433 transfers a wafer W from a load lock chamber 434 to chamber 1d and places it on the wafer holder 427. The load lock chamber 434 communicates with chamber 1d through a gate valve 432. The bottom region of chamber 1d communicates with a vacuum pump 429 by way of an exhaust pipe 430. The internal pressure in chamber 1d is maintained in the range of 0.5 to 5 milli-Torr by the vacuum chamber 429.

As shown in FIG. 11A, the first auxiliary electrode 26 has a thermoelectron emission surface 26b facing the cathode 8. The thermoelectron emission surface 26b is gently curved and in the form of a dome. A gas passage 26a is defined in the center of the first auxiliary electrode 26. The thermoelectron emission surface 26b has an elliptical or pseudo-elliptical cross section. The angle θ in FIG. 11A is desirably in the range of 5° to 30°.

In general, the ions in the plasma state move in random directions. They can be made to impinge on the electron emission surface 26b substantially at right angles thereto when they are accelerated by means of a plasma sheath. As a result, the sputtering substances 450 from the first auxiliary electrode 26 scatter at wide angles. Therefore, the sputtering substances do not easily enter a plasma generating region 452, thus preventing the wafer W from being contaminated.

As shown in FIG. 11B, a gas may be supplied in such a manner that it flows along the periphery of the first auxiliary electrode 26 toward the electron emission section 26b. When the gas is supplied in this manner, the sputtering substances 450 from the electron emission section 26b do not scatter very much, so that contamination of the wafer W can be suppressed.

As shown in FIG. 12, the central point $B_2$ of the cusp magnetic field is at the center of the inner side surface of the thermoelectron emission section 25b (i.e., distances $Y_1$ and $Y_2$ indicated in FIG. 12 are substantially equal to each other). To be more specific, the central point $B_2$ of the cusp magnetic field is an intersection between the central position axis $K_2$ and electron beam line BL. In the fourth embodiment, the central point $B_2$ of the cusp magnetic field is not an intersection $B_1$ between electron beam line BL and the plane in which the ignition section 25a and the thermoelectron emission section 25b are stacked upon each other.

When the central point $B_2$ of the cusp magnetic field is at such a position as described in the preceding paragraph, heat is transmitted from the central position of the thermoelectron emission section 25b to the peripheral positions thereof. Therefore, thermoelectrons can be emitted from the thermoelectron emission section 25b at high efficiency.

In the description of the above embodiments, reference was made to the case where an EBEP system of the present invention was applied to the plasma etching of a semiconductor wafer. However, the present invention is not limited to this; it may be applied to a CVD apparatus, a sputtering apparatus, various plasma apparatuses of electron beam excited type, etc. In addition, the object to be treated is not limited to a semiconductor wafer; it may be an LCD substrate, for example.

In the EBEP system of the present invention, the sputtering substances from the cathode do not easily enter the reaction chamber. Since, therefore, the semiconductor wafer inside the reaction chamber can be prevented from being contaminated, the EBEP system of the present invention can be suitably applied to fine working, little-damage etching, and high-speed plasma processing.

In addition, in the EBEP system of the present invention, the thermoelectron emission section (a lanthanum compound) of the cathode is not exerted with an impact at the time of the actuation of the system and is therefore prevented from being chipped or partly lost. Since the lanthanum compound is not lost, the cathode can withstand long use.

Moreover, in the EBEP system of the present invention, the cathode has a wide surface area with this structure, a discharge plasma can be stabilized in a short time from the actuation of the system. Therefore, a large number of electrons are can be emitted from the cathode at a temperature lower than 1,000° C.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electron beam excited plasma system which extracts electron beams from a discharge plasma, accelerates extracted electron beams to change a reaction gas into a plasma, and applies the plasma to a substrate, said plasma system comprising:

a first auxiliary electrode for initial discharge;

an anode having an opening;

a cathode having an opening and located between the anode and the first auxiliary electrode, wherein said cathode includes an ignition discharge section made of a metal for producing an initial discharge between the first auxiliary electrode and the cathode, and wherein said cathode further includes a thermoelectron emission section made of a non-metal for producing a plasma-generating discharge between the anode and the cathode;

a second auxiliary electrode, having an opening and located between the cathode and the anode, for facilitating generation of the discharge plasma between the cathode and the anode;

gas supply means for supplying a discharge plasma-generating gas into a region between the cathode and the anode; and magnetic field generating means for generating a magnetic field and for applying the magnetic field to the region between the cathode and the anode, such that a cusp magnetic field is generated in the vicinity of the cathode.

2. A plasma system according to claim 1, wherein said ignition discharge section is formed of a high melting point metal and is located close to the first auxiliary electrode and said thermoelectron emission section is formed of a lanthanum compound and is located close to the second auxiliary electrode.

3. A plasma system according to claim 1, further comprising a plurality of support arms for supporting the cathode inside a region where a discharge plasma is generated.

4. A plasma system according to claim 1, wherein said first auxiliary electrode is shaped like a dome and has a gently-curved discharge surface.

5. A plasma system according to claim 1, wherein said gas supply means supplies the discharge plasma-generating gas such that the discharge plasma-generating gas flows along peripheral portions of the first auxiliary electrode from a rear side of the first auxiliary electrode.

6. A plasma system according to claim 1, wherein said gas supply means supplies the discharge plasma-generating gas by way of a passage formed in the first auxiliary electrode.

7. A plasma system according to claim 1, further comprising exhaust means for exhausting a gas from a region between the second auxiliary electrode and the anode.

8. A plasma system according to claim 1, wherein said opening of the cathode is greater in diameter than the opening of the second auxiliary electrode.

9. A plasma system according to claim 1, wherein said opening of the anode is greater in diameter than the opening of the second auxiliary electrode.

10. A plasma system according to claim 1, wherein said opening of the second auxiliary electrode is smaller in diameter than the openings of the cathode and anode.

11. A plasma system according to any one of claims 8, 9 and 10, wherein said opening of the second auxiliary electrode has a diameter in the range of 2 to 6 mm.

12. A plasma system according to claim 8, wherein said opening of the cathode has a diameter in the range of 10 to 30 mm.

13. A plasma system according to claim 2, wherein said ignition discharge section of the cathode is formed of tantalum or tantalum-based alloy, and said thermoelectron emission section of the cathode is formed of $LaB_6$.

14. A plasma system according to claim 2, wherein said ignition discharge section of the cathode is located close to the first auxiliary electrode, and said thermoelectron emission section of the cathode is located close to the second auxiliary electrode.

15. A plasma system according to claim 1, wherein said magnetic field generating means includes a pair of solenoids which are coaxial and spaced from each other.

16. An electron beam excited plasma system which extracts electron beams from a discharge plasma, accelerates extracted electron beams to change a reaction gas into a plasma, and applies the plasma to a substrate, said plasma system comprising:
a first auxiliary electrode for initial discharge;
an anode having an opening;
a cathode, having an opening and located between the anode and the first auxiliary electrode, for producing an initial discharge between the first auxiliary electrode and the cathode, and for producing a plasma-generating discharge between the anode and the cathode;
a second auxiliary electrode, having an opening and located between the cathode and the anode, for facilitating generation of the discharge plasma between the cathode and the anode;
gas supply means for supplying a discharge plasma-generating gas into a region between the cathode and the anode; and
magnetic field generating means for generating a magnetic field and for applying the magnetic field to the region between the cathode and the anode, such that a cusp magnetic field is generated in the vicinity of the cathode,
said cathode including:
a small-inner-diameter ring portion formed of a high melting point metal and located in the vicinity of the first auxiliary electrode; and
a large-inner-diameter ring portion formed of a high melting point metal and located in the vicinity of the second auxiliary electrode, said large-inner-diameter ring portion having an inner diameter greater than that of the small-inner-diameter ring portion,
said large-inner-diameter ring portion being coaxial with the small-inner-diameter ring portion and spaced therefrom.

17. A plasma system according to claim 16, wherein said cathode further includes a holder member, and each of the large-inner-diameter and small-inner-diameter ring portions is detachably held by the holder means.

18. A plasma system according to claim 16, wherein said small-inner-diameter ring portion is thinner than the large-inner-diameter ring portion.

19. A plasma system according to claim 18, wherein said small-inner-diameter ring portion has a thickness in the range of 0.5 to 2 mm, and said large-inner-diameter ring portion has a thickness in the range of 2 to 6 mm.

20. A plasma system according to claim 16, wherein a gap between said large-inner-diameter ring portion and small-inner-diameter ring portion is substantially uniform and is in the range of 1 to 6 mm.

21. A plasma system according to claim 16, wherein said large-inner-diameter ring portion has an inner diameter in the range of 10 to 30 mm.

22. A plasma system according to claim 16, wherein said small-inner-diameter ring portion has an inner diameter in the range of 5 to 25 mm.

23. A plasma system according to claim 16, wherein said small-inner-diameter ring portion has a radially inner portion which is 3 to 6 mm away from the first auxiliary electrode, and said large-inner-diameter ring portion has a radially inner portion which is 6 to 50 mm away from the second auxiliary electrode.

24. A plasma system according to claim 16, wherein said small-inner-diameter ring portion and said large-inner-diameter ring portion are formed of tantalum or tantalum-based alloy.

25. A plasma system according to claim 16, wherein said magnetic field generating means includes a pair of solenoids which are coaxial and spaced from each other.

26. A plasma system according to claim 16, wherein said large-inner-diameter and small-inner-diameter ring portions include inner peripheral portions which define a main electron emission section, and said main electron emission section is directed toward the opening of the anode.

27. A plasma system according to claim 1, wherein said magnetic field generating means includes first and second solenoids which are coaxial and spaced away from each other, and said first and second solenoids generate center magnetic fields which are opposite in direction and which jointly produce a cusp magnetic field.

28. A plasma system according to claim 27, wherein said magnetic fields generated by the first and second solenoids have a magnetic intensity of 10 to 500 gauss in the vicinity of the electron emission section of the cathode.

29. A plasma system according to claim 2, wherein said cusp magnetic field has a center at a point where a beam line BL intersects with an axis K of a plane in which the ignition discharge section and the thermoelectron emission section are stacked upon each other.

30. A plasma system according to claim 2, wherein said cusp magnetic field has a center at a point where a beam line BL intersects with a central position axis $K_2$ of an inner side surface of the thermoelectron emission section.

31. A plasma system according to claim 2, wherein said first auxiliary electrode has a surface which faces the cathode and which is gently curved like a dome.

32. A plasma system according to claim 2, wherein an impedance as viewed from the first auxiliary electrode to a common grounding point is higher than an impedance as viewed from the second auxiliary electrode to the common grounding point.

33. A plasma system according to claim 2, wherein a pressure in a region between the first and second auxiliary electrodes is higher than a pressure in a region between the second auxiliary electrode and the anode.

34. A plasma system according to claim 2, wherein said cathode has an inner diameter in the range of 15 to 50 mm, and said second auxiliary electrode has an inner diameter in the range of 2 to 5 mm.

35. A plasma system according to claim 2, wherein said discharge plasma-generating gas flows from a rear side of the first auxiliary electrode toward the electron emission section along the along peripheral portions of the first auxiliary electrode.

* * * * *